US007421250B2

(12) United States Patent
Shi

(10) Patent No.: US 7,421,250 B2
(45) Date of Patent: Sep. 2, 2008

(54) RADIO FREQUENCY INTEGRATED CIRCUIT

(75) Inventor: Hong Shi, Redondo Beach, CA (US)

(73) Assignee: Broadcom Corporation, Irvine, CA (US)

( * ) Notice: Subject to any disclaimer, the term of this patent is extended or adjusted under 35 U.S.C. 154(b) by 252 days.

(21) Appl. No.: 11/223,170

(22) Filed: Sep. 9, 2005

(65) Prior Publication Data

US 2006/0035595 A1 Feb. 16, 2006

Related U.S. Application Data

(63) Continuation of application No. 10/103,365, filed on Mar. 21, 2002, now Pat. No. 6,980,774.

(60) Provisional application No. 60/350,660, filed on Jan. 22, 2002.

(51) Int. Cl.
*H04B 1/38* (2006.01)
(52) U.S. Cl. .............................. 455/73; 455/84; 455/86; 455/118; 455/313; 375/316; 375/317; 375/318
(58) Field of Classification Search .................. 455/73, 455/84, 86, 118, 313; 375/316, 317, 318
See application file for complete search history.

(56) References Cited

U.S. PATENT DOCUMENTS 5,806,562 A * 9/1998 Park ............................ 137/571
6,366,622 B1 * 4/2002 Brown et al. .................. 375/322
6,804,497 B2 * 10/2004 Kerth et al. .................... 455/88

\* cited by examiner

*Primary Examiner*—Sanh D Phu
(74) *Attorney, Agent, or Firm*—Garlick Harrison & Markison; Timothy W. Markison; Kevin L. Smith

(57) ABSTRACT

A radio frequency (RF) integrated circuit (IC) includes a local oscillation module, analog radio receiver, analog radio transmitter, digital receiver module, digital transmitter module, and digital optimization module. The local oscillation module is operably coupled to produce at least one local oscillation. The analog radio receiver is operably coupled to directly convert inbound RF signals into inbound low intermediate frequency signals based on the local oscillation. The digital receiver module is operably coupled to process the inbound low IF signals in accordance with one of a plurality of radio transceiving standards to produce inbound data. The digital transmitter is operably coupled to produce an outbound low intermediate frequency signal by processing outbound data in accordance with the one of the plurality of radio transceiving standards. The analog radio transmitter is operably coupled to directly convert the outbound low IF signals into outbound RF signals based on the local oscillation. The digital optimization module is operably coupled to the local oscillation module, the analog radio receiver and/or the analog radio transmitter to optimize performance of at least one aspect of the local oscillation module, the analog radio receiver and/or the analog radio transmitter for the given radio transceiving standard being implemented.

4 Claims, 10 Drawing Sheets digital transmitter section 160 digital transmitter section 170 digital receiver section 190 digital receiver section 200 analog receiver 77 analog receiver 77 analog radio transmitter 79

RADIO FREQUENCY INTEGRATED CIRCUIT

This patent application is claiming priority under 35 USC § 120 as a continuing patent application of patent application entitled RADIO FREQUENCY INTEGRATED CIRCUIT, having a filing date of Mar. 21, 2002 and a Ser. No. of 10/103,365, now U.S. Pat. Ser. No. 6,980,774, issued Dec. 27, 2005, which claims priority from provisional application Ser. No. 60/350,660, filed Jan. 22, 2002, now expired, each of which is hereby incorporated herein by reference.

RELATED PATENT APPLICATIONS

| No. | Docket No. | Appl. No. | Title | Filing Date | Inventors |
|---|---|---|---|---|---|
| 1 | BP 1988 | 09/993,801 | INTEGRATED MULTIMODE RADIO AND COMPONENTS THEREOF | Nov. 14, 2001 | Darabi et al. |
| 2 | BP 1989 | 10/015,993 | FREQUENCY SYNTHESIZER FOR DUAL MODE RADIO BLUETOOTH AND 802.11 APPLICATIONS | Dec. 12, 2001 | Chien et al. |
| 3 | BP 1990 | 10/055,581 | FREQUENCY SYNTHESIZER FOR 802.11 APPLICATIONS | Jan. 23, 2002 | Anand et al. |
| 4 | BP 1991 | 10/037,246 | METHOD AND APPARATUS FOR FREQUENCY SHIFT-KEYING DEMODULATION AND APPLICATIONS THEREOF | Oct. 23, 2001 | Khorram |
| 5 | BP 1992 | 09/993,541 | DIGITAL DEMODULATION AND APPLICATIONS THEREOF | Nov. 14, 2001 | Jensen et al. |
| 6 | BP 2121 | 10/138,605 | ANALOG MODULATOR IN BLUETOOTH RADIO | May 3, 2002 | Darabi |
| 7 | BP 2122 | 10/138,678 | ANALOG POWER DETECTION FOR GAIN CONTROL OPERATIONS | May 3, 2002 | Darabi |
| 8 | BP 2123 | 10/138,801 | METHOD AND APPARATUS FOR DC OFFSET CANCELLATION | May 3, 2002 | Darabi et al. |
| 9 | BP 2124 | 10/138,752 | HIGH SPEED OPERATIONAL AMPLIFIER | May 3, 2002 | Darabi et al. |
| 10 | BP 2125 | 10/138,601 | LNA GAIN ADJUSTMENT FOR INTERMODULATION INTERFERENCE REDUCTION | May 3, 2002 | Darabi |
| 11 | BP 2127 | 10/138,602 | LOW NOISE AMPLIFIER (LNA) GAIN SWITCH CIRCUIT | May 3, 2002 | Darabi |
| 12 | BP 2128 | 10/303,384 | MOS CAPACITORS FOR BYPASSING BIAS LINES | Nov. 28, 2002 | Anand |
| 13 | BP 2129 | 10/159,365 | PROGRAMMABLE GAIN AMPLIFIER (PGA) WITH AGC | May 31, 2002 | Anand |
| 14 | BP 2133 | 10/074,537 | Calibration Circuit for VCO | Feb. 12, 2002 | Khorram |
| 15 | BP 2134 | 10/074,572 | Improved Charge Pump for PLL | Feb. 12, 2002 | Khorram |
| 16 | BP 2146 | 10/094,587 | SELF-CALIBRATING DIRECT CONVERSION TRANSMITTER | Mar. 8, 2002 | Shi et al. |
| 17 | BP 2057 | 09/966,060 | LNA GAIN ADJUSTMENT IN AN RF RECEIVER TO COMPENSATE FOR INTERMODULATION INTERFERENCE | Sep. 28, 2001 | Shi |
| 18 | BP 2153 | 10/094,495 | RADIO HAVE A SELF CALIBRATING TRANSMITTER | Mar. 8, 2002 | Shi et al. |
| 19 | BP 2199 | 10/077,571 | PROGRAMMABLE MIXER AND RADIO APPLICATIONS THEREOF | Feb. 15, 2002 | Khorram |
| 20 | BP 2107 | 10/074,294 | DATA RECOVERY SYSTEM AND APPLICATIONS THEREOF IN RADIO RECEIVERS | Feb. 12, 2002 | Jensen et al. |

TECHNICAL FIELD OF THE INVENTION

This invention relates generally to communication systems and more particularly to radio transceivers used within such communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Such standards dictate the type of communication, type of encoding, type of modulation, channel access protocols, intercommunication between components of a wireless communication device, etc. The specifying of intercommunications between components, such as digital signal processors and radio transceivers, primarily limits the data exchanged between such components to standard compliant data. Thus, the standardization of wireless communications enables multiple manufacturers equipment to interoperation with each others equipment, which helps reduce the cost of wireless communications, the standards leave little room for optimization of inter-component performance.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel. For indirect wireless communications, each wireless communication device communicates directly with an associated base station (e.g., for cellular services) and/or an associated access point (e.g., for an in-home or in-building wireless network) via an assigned channel. To complete a communication session between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data directly or in one or more intermediate frequency stages to produce the RF signals.

As the demand for enhanced performance (e.g., reduced interference and/or noise, improved quality of service, compliance with multiple standards, increased broadband applications, et cetera), smaller sizes, lower power consumption, and reduced costs increases, wireless communication device engineers are faced with a very difficult design challenge to develop such a wireless communication device. Typically, an engineer is forced to compromise one or more of these demands to adequately meet the others. For instance, an engineer may choose a direct conversion topology (i.e., convert directly from an RF signal to a base-band signal or directly from a base-band signal to an RF signal) to meet size requirements and/or broadband application requirements. However, for direct conversion transceivers, DC offset, IQ mismatch, and local oscillation leakage are more detrimental to overall performance.

Costs of manufacturing a radio frequency integrated circuit (IC) may be reduced by switching from one integrated circuit manufacturing process to another. For example, a CMOS process may be used instead of a GaAs, silicon bipolar or bi-CMOS process since it is a more cost affective method of IC manufacture and is typically the technology choice for digital ICs. Such a CMOS process, however, increases temperature and process related variations. As such, noise, gain variation, mismatches and other factors that negatively impact an RF IC performance are increased for a CMOS process. Thus, in many RF IC applications, a designer chooses between cost savings and performance.

Therefore, a need exists for a low power, reduced size, reduced cost, and robust performance radio, radio transmitter, radio receiver, and/or components thereof.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAIL DESCRIPTION OF A PREFERRED EMBODIMENT

Figure 1:
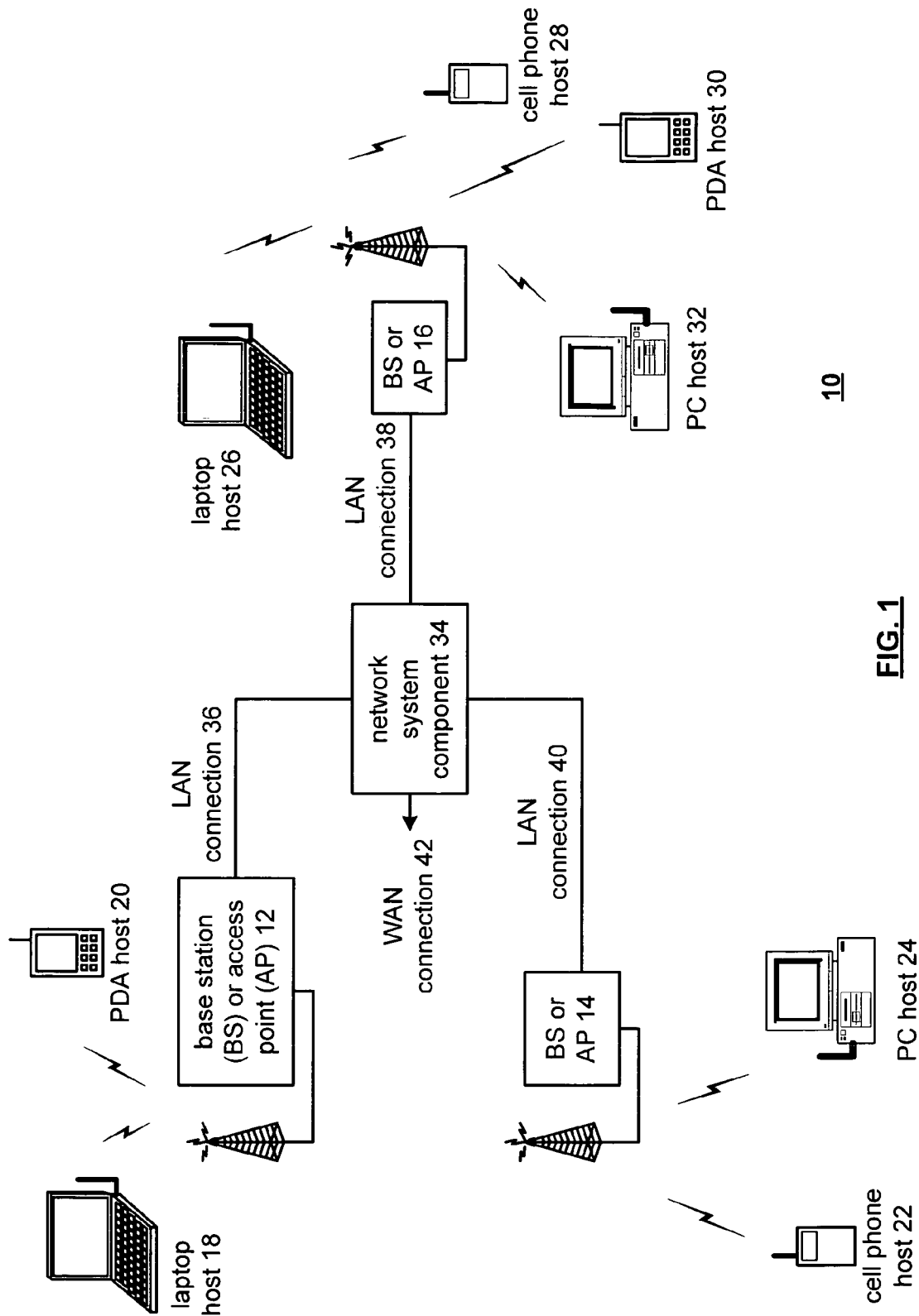
FIG. 1 illustrates a schematic block diagram of a communication system that includes wireless communication devices having radio frequency integrated circuits in accordance with the present invention.

FIG. 1 illustrates a schematic block diagram of a communication system 10 that includes a plurality of base stations and/or access points 12-16, a plurality of wireless communication devices 18-32 and a network system component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network system component 34 via local area network connections 36, 38 and 40. The network system component 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
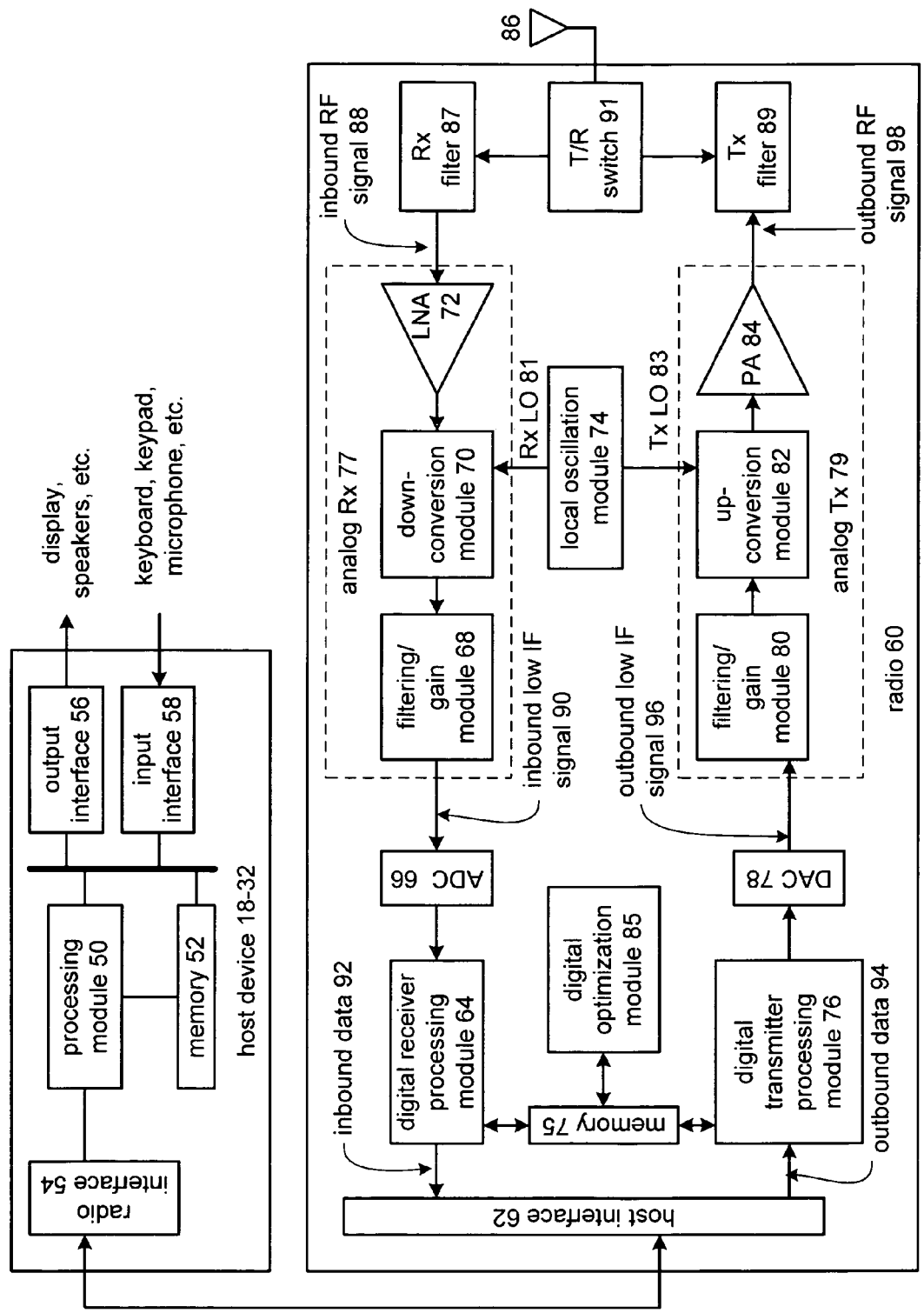
FIG. 2 illustrates a schematic block diagram of a host device and corresponding radio in accordance with the present invention.

FIG. 2 illustrates a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received inbound data may be displayed and/or rendered audible. The radio interface 54 also provides outbound data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, analog-to-digital converter 66, filtering/gain module 68, down conversion module 70, low noise amplifier 72, local oscillation module 74, memory 75, digital transmitter processing module 76, digital-to-analog converter 78, filtering/gain module 80, up-conversion module 82, power amplifier 84, digital optimization module 85, an antenna 86, a receiver filter 87, a transmitter filter 89, and a transmit/receive switch 91. The antenna 86 may be a single antenna that is shared, via the transmit/receiver switch 91, by the transmit and receive paths or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver fuictions and digital transmitter functions of one or more of a plurality of wireless transceiver standards, respectively. The digital receiver functions include, but are not limited to, digital intermediate frequency to baseband conversion, demodulation, constellation demapping, decoding, and/ or descrambling. The digital transmitter functions include, but are not limited to, scrambling, encoding, constellation mapping, modulation, and/or digital baseband to IF conversion.

The digital optimization module 85 monitors the performance of the local oscillation module 74, the analog receiver section 77, and/or the analog transmitter section 79 in accordance with one or more of the plurality of wireless transceiver standards. If the digital optimization module 85 determines that the performance of the local oscillation module 74, the analog receiver 77, and/or the analog transmitter 79 may be improved, the digital optimization module 85 generates a corresponding control signal and provides it the appropriate analog module.

The digital receiver 64, the transmitter processing modules 76, and the digital optimization module 85 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64, 76 and/or 85 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64, 76 and/or 85 executes, operational instructions corresponding to at least some of the functions illustrated in FIGS. 3-12.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84 amplifies the RF signal to produce outbound RF signal 98. The Tx filter 89, which may be a bandpass filter, filters the outbound RF signal 98 and provides the filtered outbound RF signal to the T/R switch 91. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the T/R switch 91, which, in turn, forwards the signal 88 to the Rx filter 87. The Rx filter 87, which may be a bandpass filter, filters the inbound RF signal and provides the filtered RF signal to the low noise amplifier 72, which amplifies the signal 88 to produce an amplified inbound RF signal. The low noise amplifier 72 provide the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

The digital optimization module 85 is operably coupled to the analog receiver 77, the local oscillation module 74, and/or the analog transmitter 79. In general, the analog receiver 77, the local oscillation module 74, and/or the analog transmitter 79 produce monitoring data that indicates performance of the respective module. The digital optimization module 85 receives the monitoring data and interprets it to determine how the respective module can be optimized. Based on the interpretation, the digital optimization module 85 generates compensation control signals and provides them to the analog receiver 77, the local oscillation module 74, and/or the analog transmitter 79. The modules 74, 77 and/or 79 adjust there operation in accordance with the compensation control signals such that local oscillation leakage is reduced, DC offset is reduced, noise is reduced, gain imbalances are reduced, adverse affects due to integrated circuit process variations are reduced, increase integration between analog portions of the radio system and digital portions of the radio system, et cetera.

Figure 3:
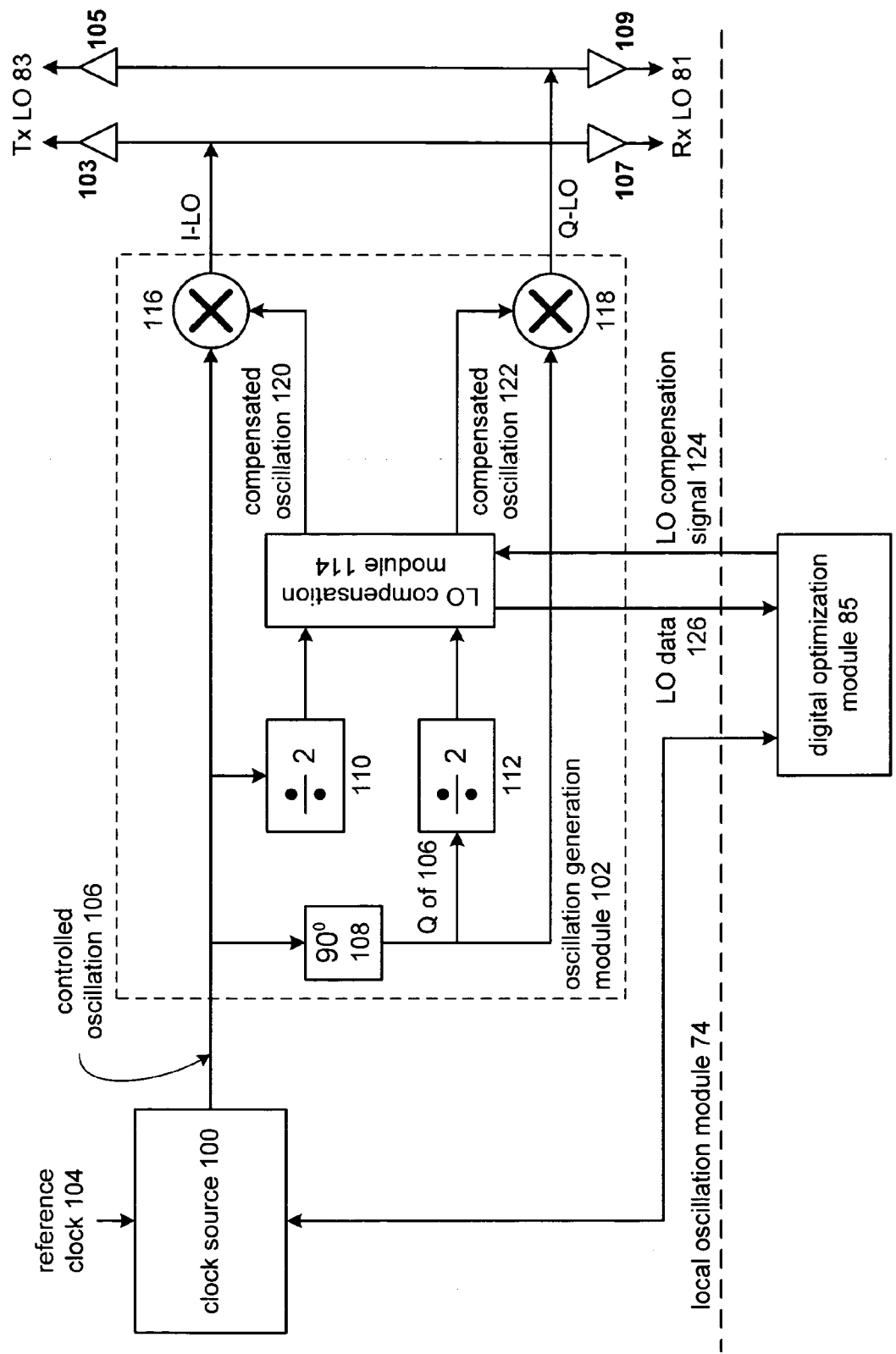
FIGS. 3 and 4 illustrate a local oscillation module and digital optimization module in accordance with the present invention.

FIG. 3 illustrates a schematic block diagram of the local oscillation module 74 operably coupled to the digital optimization module 85. The local oscillation module 74 includes a clock source 100, oscillation generation module 102 and a plurality of buffers 103, 105, 107, and 109. The oscillation generation module 102 includes a phase-shift module 108, a $1^{st}$ divider 110, a $2^{nd}$ divider 112, a local oscillation compensation module 114, a $1^{st}$ mixing module 116, and a $2^{nd}$ mixing module 118.

In operation, the clock source 100 generates a controlled oscillation 106 from a reference clock 104. One embodiment of the clock source 100 will be described in greater detail with reference to FIG. 4. The clock source 100 may be optimized based on information exchanged with the digital optimization module 85 as will also be discussed with reference to FIG. 4.

The oscillation generation module 102 receives the controlled oscillation 106 and produces an I component and a Q component of a local oscillation. To achieve this, the phase-shift module 108, the $1^{st}$ divider 110, and the $1^{st}$ mixing module 116 receive the controlled oscillation 108. Note that the frequency of the controlled oscillation 106 for this embodiment of the oscillation generation module 102 is $\frac{2}{3}^{rds}$ that of the desired frequency of the local oscillation 81 or 83.

The $1^{st}$ divider 110, divides the frequency of the controlled oscillation 106 by a factor of 2 to produce a $1^{st}$ divided frequency. The local oscillation compensation module 114, which may be further described in related patent application # 3, compensates the divided frequency to produce a compensated oscillation 120. The local oscillation compensation module 114 monitors the $1^{st}$ and $2^{nd}$ divided signals to produce local oscillation data 126, which is provided to digital optimization module 85. The digital optimization module 85 interprets the local oscillation data 126 to produce a local oscillation compensation signal 124. The functionality performed by the digital optimization module 85 may be further described in related patent application #3. As such, the local oscillation compensation module 114 compensates for DC offsets, integrated circuit process variations, temperature variations, noise and/or excess power consumption to produce the compensated oscillation 120. The $1^{st}$ mixing module 116 mixes the controlled oscillation 106, which has a $\frac{2}{3}^{rds}$ frequency of the local oscillation, with the compensated oscillation 120, which has a $\frac{1}{3}^{rd}$ frequency of local oscillation, to produce an I component of the local oscillation.

The phase-shift module 108 shifts the phase of the controlled oscillation 106 by 90° to produce a Q component of the controlled oscillation 106. The $2^{nd}$ divider 112 divides the frequency of the Q component of controlled oscillation 106 to produce a $2^{nd}$ divided frequency. The local oscillation compensation module 114 adjusts the $2^{nd}$ divided frequency to compensate for DC offset, IC process variations, temperature variations, noise, and/or power consumption to produce a $2^{nd}$ compensated oscillation 122. The $2^{nd}$ mixing module 118 mixes the compensated oscillation 122 with the Q component of the controlled oscillation 106 to produce a Q component of the local oscillation.

Buffers 103 and 105 buffer the I and Q components of the local oscillation to produce the transmitter local oscillation 83. Buffers 107 and 109 buffer the I and Q components of the local oscillation to produce the receiver local oscillation 81.

Figure 4:
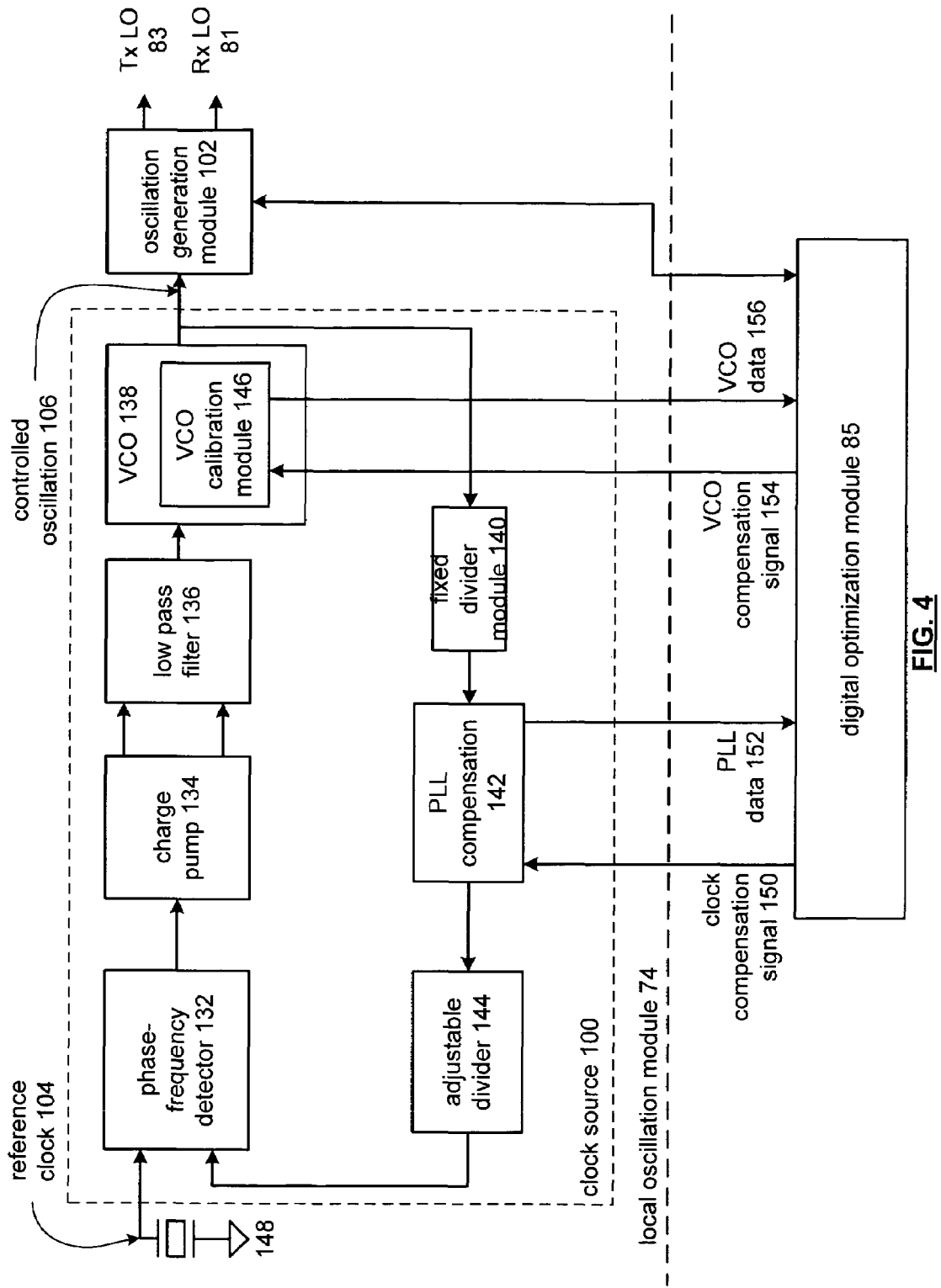

FIG. 4 illustrates the local oscillation 74 and digital optimization module 85. In this illustration, the clock source 100 is shown to include a phase and frequency detector 132, charge pump 134, low pass filter 136, voltage controlled oscillator 138, fixed divider module 140, phase lock loop compensation module 142 and adjustable divider 144. The voltage control oscillator 138 may include a voltage control calibration module 146.

A crystal 148 generates the reference clock 104 and provides it to the phase and frequency detector 132. The phase and frequency detector 132 generates a difference signal based on a phase and/or frequency difference between the reference clock 104 and the feedback received from the adjustable divider 144. The charge pump 134, which may be implemented as disclosed in related patent application # 13, produces a charge-up or charge-down signal from the difference signal. The low pass filter 136 filters the charge-up or charge-down signal and then provides the filtered signal to the voltage control oscillator 138.

The voltage control oscillator 138 generates the controlled oscillation 106 from the received filtered signal. In addition, the voltage control oscillator may include voltage control calibration module 146 to fine-tune the generation of the controlled oscillation 106. In general, the voltage control calibration module 146, which is further described in related patent application # 12, generates VCO data 156 and provides it to the digital optimization module 85. The digital optimization module 85 interprets the VCO data 156 and generates VCO compensation signal 154 and provides it to the VCO calibration module 146. Based on the compensation signal 154, the VCO calibration module 146 compensates the generation of the controlled oscillation 106 to reduce noise, power, et cetera.

The fixed divider module 140 divides the controlled oscillation 106 by a fixed value. The phase lock loop compensation module 142 interprets the fixed divided feedback to produce phase lock loop data 152, which is provided to the digital optimization module 85. The digital optimization module 85 interprets the phase lock loop data 152 to produce clock compensation signals 150, which are provided back to the phase lock loop compensation module 142. Based on the compensation signal 150, the phase lock loop compensation module 142 compensates for noise, power consumption, et cetera contained within the fixed divided feedback. The functionality of the phase lock loop compensation module 142 and corresponding operations performed by the digital optimization module 85 are further described in related patent application # 2.

The adjustable divider 144, which may include a Delta Sigma modulator, further divides the compensated fixed divider to produce the feedback signal provided to the phase frequency detector 132. As known, by adjusting the adjustable divider 144, the controlled oscillation 106 may be adjusted. By adjusting the controlled oscillation 106, the resulting local oscillations 81 and 83 are correspondingly adjusted.

Figure 5:
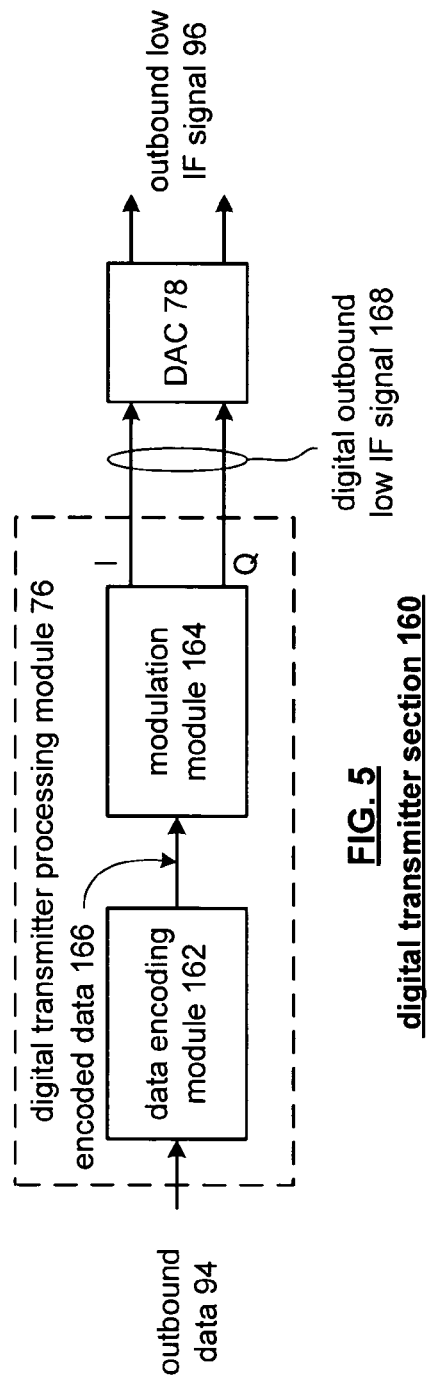
FIG. 5 illustrates a schematic block diagram of a digital transmitter section in accordance with the present invention.

FIG. 5 illustrates a schematic block diagram of a digital transmitter section 160 that includes the digital transmitter processing module 76, which is configured to include a data encoding module 162 and modulation module 164. In this embodiment, the data encoding module 162 receives outbound data 94 from the host device and produces therefrom encoded data 166. Depending on the particular radio transceiver standard being implemented by the radio (e.g., Bluetooth, IEEE 802.11, etc.), the data encoding module 162 may perform a variety of encoding functions.

The modulation module 164 receives the encoded data 166 and produces therefrom I and Q components of digital outbound low IF signal 168. Depending on the particular radio transceiver standard being implemented, the modulation module 164 may produce a baseband I and Q outbound signal 168 or an intermediate frequency signal having an intermediate frequency of up to a few megahertz. In addition, the type of modulation performed by modulation module 164 is dependent on the particular type of radio transceiver standard being implemented. For example, for Bluetooth, the modulation scheme is frequency shift keying (FSK). As such, the modulation module 164 frequency shift keys the encoded data 166 to produce the digital outbound low IF signal 168. The digital-to-analog converter 78 converts the digital outbound low IF signal 168 into the outbound low IF signal 96.

Figure 6:
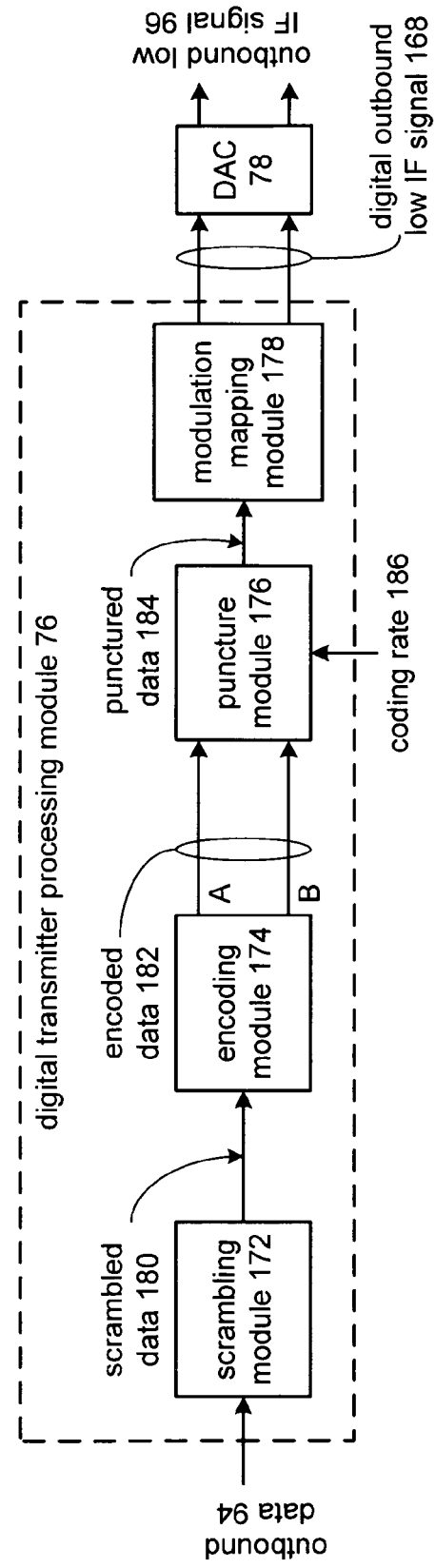
FIG. 6 illustrates a schematic block diagram of an alternate embodiment of a digital transmitter section in accordance with the present invention.

FIG. 6 illustrates a digital transmitter section 170 that is implemented to be compliant with at least one of the IEEE 802.11 radio transceiver standards. In this embodiment, the digital transmitter processing module 76 is configured to include a scrambling module 172, an encoding module 174, a puncture module 176 and a modulation mapping module 178. In this embodiment, the scrambling module 172 scrambles outbound data 94 to produce scrambled data 180. The particular type of scrambling is in accordance with the IEEE 802.11 specification.

The encoding module 174 encodes the scrambled data 180 to produce A and B encoded data 182 in accordance with the IEEE 802 specification. The puncture module 176, based on a coding rate 186, removes bits from the A and B encoded data 182 to produce punctured data 184, i.e., compressed data.

The modulation mapping module 178, in accordance with the IEEE 802.11B standard, maps the punctured data 184 into binary phase shift keying (BPSK), quadrature phase shift keying (QPSK) symbols. The symbols are outputted as the I component and Q component of the digital outbound low IF signal 168. The digital-to-analog converter 78 converts the digital outbound low IF signal 168 into the outbound low IF signal 96.

Figure 7:
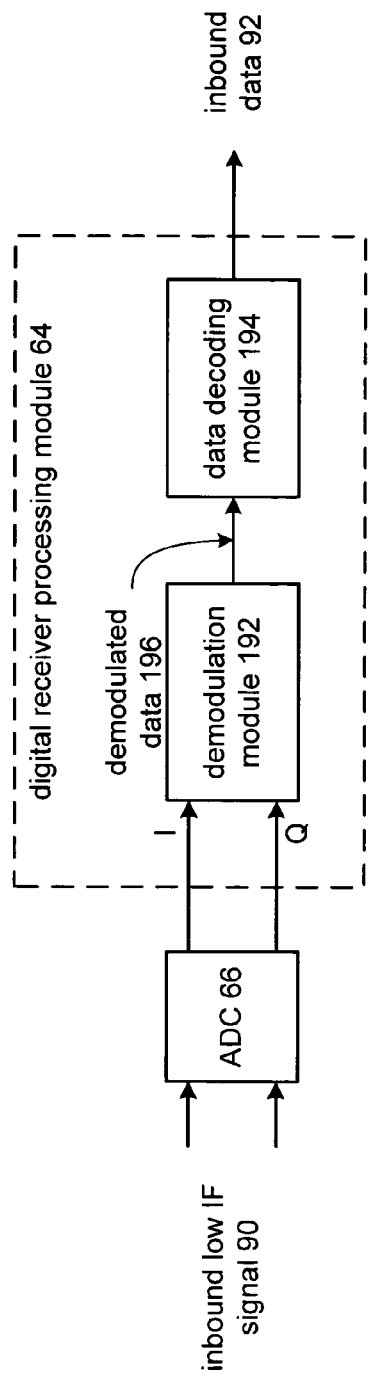
FIG. 7 illustrates a schematic block diagram of a digital receiver section in accordance with the present invention.

FIG. 7 illustrates a schematic block diagram of a digital receiver section 190 that includes the digital receiver processing module 64. The digital receiver processing module 64 is configured to include a demodulation module 192 and a data decoding module 194.

In operation, the analog-to-digital converter 66 receives the inbound low IF signal 90 and produces a digital representation thereof. The digital demodulation module 192 receives an I and Q component of the digital low IF signal generated by the ADC 66 and produces therefrom demodulated data 196. The particular type of demodulation performed by demodulation module 192 is dependent on the particular physical layer communication standard being implemented. In particular, if the physical layer communication standard is in accordance with Bluetooth, the demodulation module 192 is demodulating FSK signals. As such, the demodulation module 192 may include functionality as disclosed in related patent applications # 4 and/or # 5.

The data decoding module 194 receives the demodulated data 196 and produces therefrom the inbound data 92. The functionality of the data decoding module 194 is dependent on the particular radio transceiver standard being implemented. If the standard is Bluetooth, the data decoding module 194 interprets the demodulated data 196 in accordance with that standard. In particular, the data decoding module 194 may include enhancements as disclosed in related patent applications # 4 and/or # 20.

Figure 8:
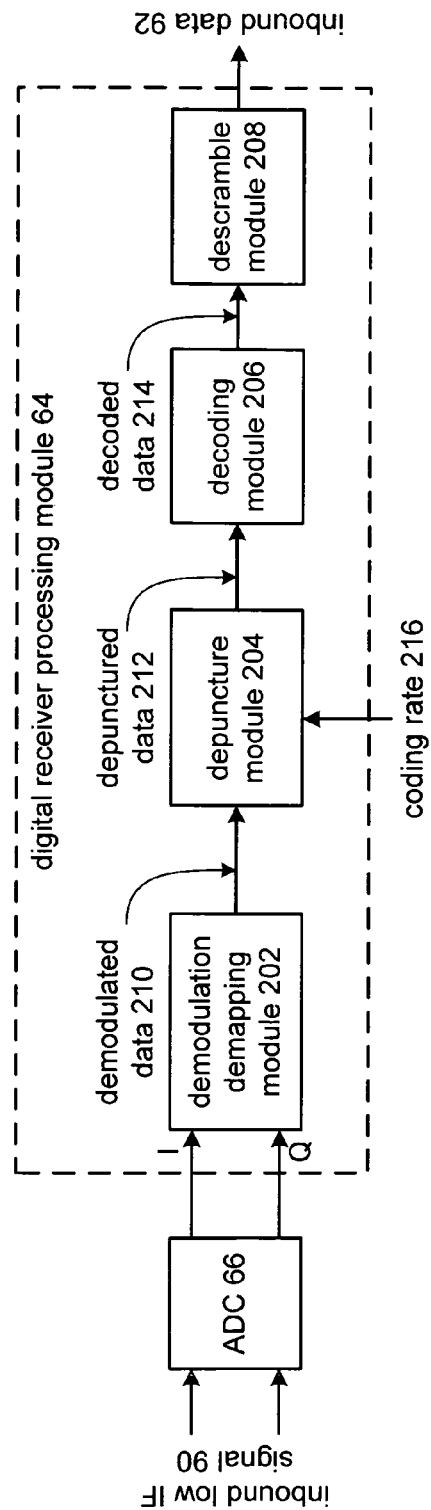
FIG. 8 illustrates a schematic block diagram of an alternate digital receiver section in accordance with the present invention.

FIG. 8 illustrates a schematic block diagram of a digital receiver section 200 that is constructed to be compliant with an IEEE 802.11B standard. In this embodiment, the digital receiver processing module 64 is configured to include a demodulation demapping module 202, depuncture module 204, decoding module 206 and descramble module 208.

The demodulation demapping module 202 receives an I and Q component from the analog-to-digital converter 66. Based on the particular modulation (e.g., BPSK, QPSK), the demodulation demapping module 202 interprets the symbols represented by the I and Q components to produce the demodulated data 210. The depuncture module 204, based on decoding rate 216, adds bits back to the demodulated data 210 to produce depunctured data 212, or decompressed data. The decoding module 206 decodes the depunctured data 212 to produce decoded data 214. The descrambling module 202 descrambles the decoded data 214 to produce the inbound data 92.

Figure 9:
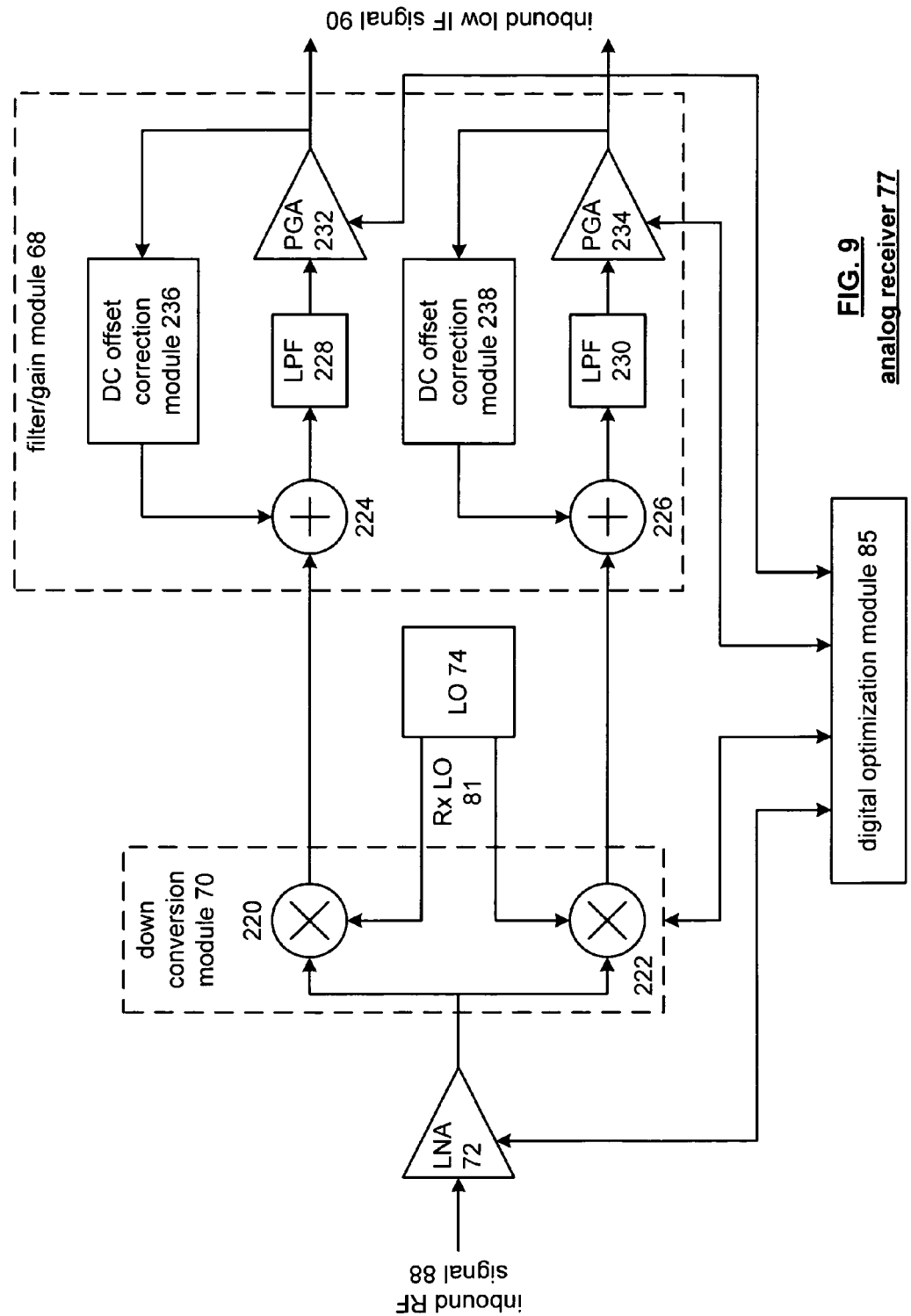
FIG. 9 illustrates a schematic block diagram of an analog receiver and digital optimization module in accordance with the present invention.

FIG. 9 illustrates a schematic block diagram of the analog receiver 77 that is constructed as a direct conversion receiver. In such an embodiment, the analog receiver 77 may be compliant-with an IEEE 802.11B standard. As illustrated, the analog receiver 77 includes a low noise amplifier 72 a down-conversion module 70, and the filter/gain module 68. The down-conversion module 70 includes a $1^{st}$ mixing module 220 and a $2^{nd}$ mixing module 222. The filter/gain module 66 includes a $1^{st}$ summing module 224, $2^{nd}$ summing module 226, $1^{st}$ low pass filter 228, $2^{nd}$ low pass filter 230, $1^{st}$ programmable gain amplifier 232, $2^{nd}$ programmable gain amplifier 234, $1^{st}$ DC offset correction module 236 and $2^{nd}$ DC offset correction module 238. Note that various embodiments of the filter/gain module 68 may omit the DC offset correction modules and corresponding summing modules, may replace the programmable gain amplifiers with regular amplifiers, and/or the low pass filters 228 and 230 may include high speed operational amplifiers as disclosed in related patent application # 8.

In operation, the analog receiver 77 receives an inbound RF signal 88 via the low noise amplifier 72. The low noise amplifier 72 may be a programmable low noise amplifier as disclosed in related patent applications # 9 and/or # 10 and/or #17. If the low noise amplifier 72 is programmable, information regarding its performance is collected and provided to the digital optimization module 85. The digital optimization module 85 interprets the data and provides feedback to optimize the performance of the low noise amplifier by reducing noise, reducing power consumption, reducing the effects of IC process variations, temperature variations, et cetera. Regardless of its particular implementation, the low noise amplifier provides an amplified input RF signal 88 to the down-conversion module 70.

The down-conversion module 70, via the $1^{st}$ and $2^{nd}$ mixing modules 220 and 222, mixes the inbound RF signal with the receiver local oscillation 81 to produce a $1^{st}$ baseband signal and $2^{nd}$ baseband signal, which may correspond to an I component and a Q component of the baseband signal. Note that the $1^{st}$ and $2^{nd}$ mixing modules 220 and 222 may be programmable mixing modules as disclosed in related patent application # 19. If the mixing modules 220 and 222 are programmable, information regarding their performance is collected and provided to the digital optimization module 85. The digital optimization module 85 interprets the data and provides feedback to optimize the performance of the mixing modules 220 and 222 by reducing noise, reducing power consumption, reducing the adverse effects of IC process variations and temperature variations, et cetera, which may lead to local oscillation leakage.

The $1^{st}$ summing module 224 sums a DC offset corrected signal with the $1^{st}$ baseband signal to provide a $1^{st}$ summed signal. The low pass filter 228, which may include a high-speed operational amplifier as disclosed in related patent application # 8, low pass filters the signal and provides the filtered signal to the programmable gain amplifier 232. Similarly, the $2^{nd}$ summing module 226 mixes the $2^{nd}$ baseband signal with the DC offset correction signal from module 238 to produce a $2^{nd}$ summed signal. Low pass filter 230, which may also include a high-speed operational amplifier as disclosed in related patent application # 8, produces a low pass filtered signal, which is provided to a programmable gain amplifier 234.

Programmable gain amplifier 232 and programmable gain amplifier 234 amplify their respective signals to produce the I and Q components of the inbound low IF signal 90. The programmable gain amplifiers may be constructed in accordance with the teachings of related patent applications # 6, # 10, and/or #11. In general, the programmable gain amplifiers 232 and 234 collect data regarding their performance and provide the data to the digital optimization module 85. The digital optimization module 85 interprets the data and provides compensation signals to programmable gain amplifier 232 and/or to programmable gain amplifier 234. Such compensation signals cause the programmable gain amplifiers 232 and/or 234 to modify its performance to compensate for noise, power consumption, and/or effects caused by IC process variations, temperature variations, et cetera.

The DC offset correction modules 236 and 238 are operably coupled to monitor the outputs of programmable gain amplifiers 232 and 234, respectively. If a DC offset is detected, the DC offset correction modules 236 and 238 provide a compensation signal to the corresponding summing modules 224 and 226. The DC offset correction modules 236 and 238 may be constructed as disclosed in related patent application # 7.

Figure 10:
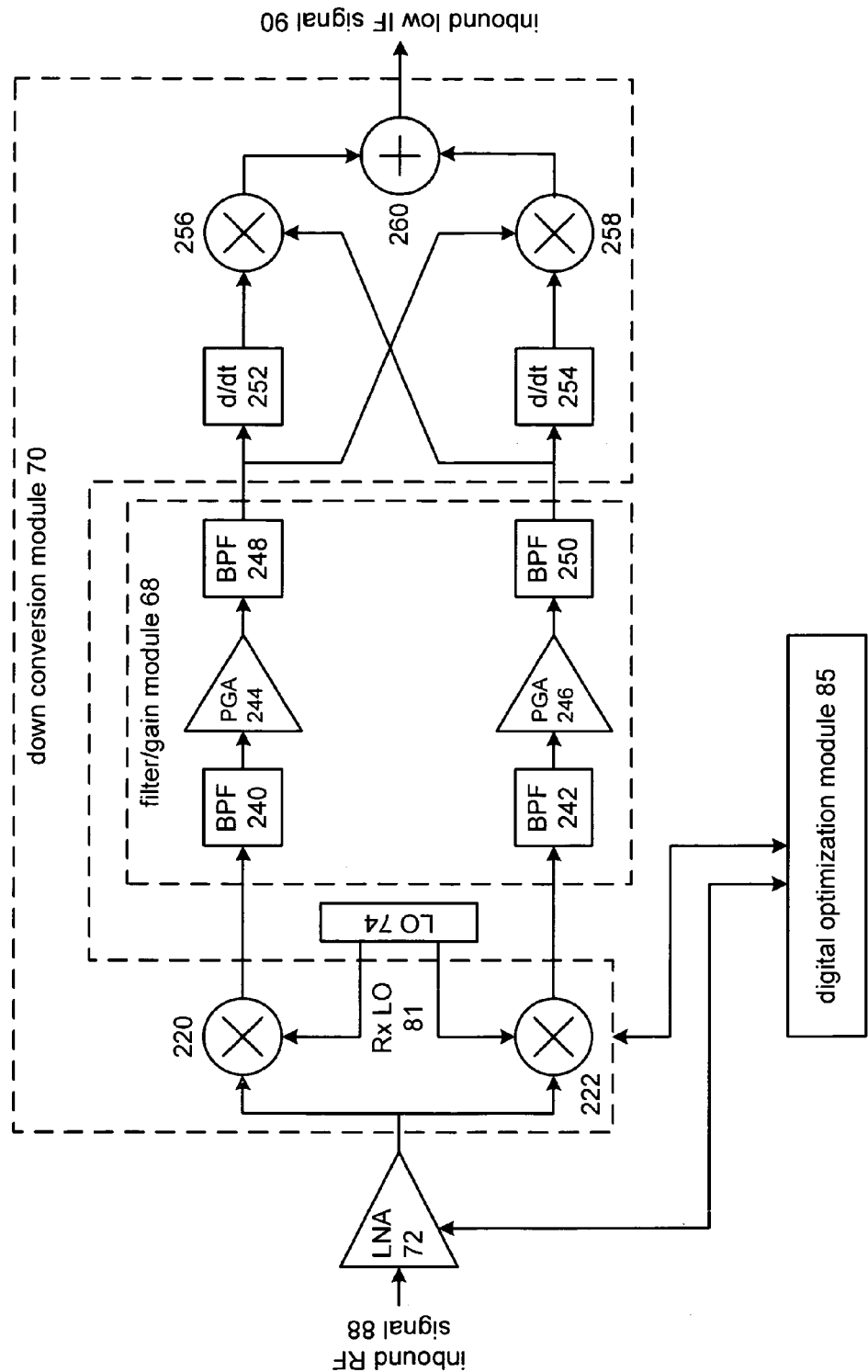
FIG. 10 illustrates a schematic block diagram of an alternate embodiment of an analog receiver and digital optimization module in accordance with the present invention.

FIG. 10 illustrates a schematic block diagram of a multiple IF stage analog receiver 77. In this embodiment, the analog receiver 77 includes low noise amplifier 72, the down-conversion module 70, and the filter/gain module 68. The low noise amplifier 72 may be programmable in accordance with related patent applications #9 and/or #10 and/or 17. The down-conversion module 70 includes a $1^{st}$ IF stage that includes mixing modules 220 and 222, which produce an IF signal having a low IF carrier frequency in the range of 0 hertz to a few megahertz, and a $2^{nd}$ IF stage, which converts the low IF signal into a baseband signal. The low IF to baseband portion of the down-conversion module 70 includes a $1^{st}$ differentiator 252, $2^{nd}$ differentiator 254, mixing module 256, mixing module 258 and summing module 260.

The filter/gain module 68 includes bandpass filters 240 and 242, programmable gain amplifiers 244 and 246 and bandpass filters 248 and 250. The programmable gain amplifiers may be constructed in accordance with the teachings of related patent applications # 6, #10, and/or #11. The mixing modules 220 and 222 may programmable and constructed in accordance with the teachings of related patent application # 19.

In operation, the low noise amplifier 72 receives inbound RF signals 88 and provides amplified versions thereof to the $1^{st}$ and $2^{nd}$ mixing modules 220 and 222. The $1^{st}$ and $2^{nd}$ mixing modules mix their respective signals with the receiver local oscillation 81. The bandpass filters 240 and 242 filter the outputs of mixers 220 and 222 and provide the filter signals to programmable gain amplifiers 244 and 246. The programmable gain amplifiers 244 and 246 adjust the gain of the signal, which are then filtered via bandpass filters 248 and 250.

The filtered low IF signals are then provided to the low IF to baseband portion of down-conversion module 70, which differentiates the signals via differentiators 252 and 254 and then mixes the differentiated signals with the opposite signals in mixers 256 and 258 to produce difference signals that once summed via 260 produce a baseband representation of the inbound low IF signal 90.

The analog receiver 77 may be constructed to be compliant with the Bluetooth standard where the $1^{st}$ and $2^{nd}$ mixing modules 220 and 222 step-down the carrier frequency of the inbound RF signal 88 from approximately 2.4 gigahertz to approximately 2 megahertz. In addition, the low noise amplifier and mixing modules 220 and 222 may be shared in a wide bandwidth system as disclosed in related patent application # 1.

As an alternative embodiment, the down-conversion module 70 may omit the low IF to baseband section and transmit the low IF signals having a carrier frequency of a few megahertz directly to the digital receiver section. The digital receiver section then would perform the low IF to baseband conversion before performing the demodulation functions and decoding functions, et cetera as previously described in FIGS. 7 and 8.

Figure 11:
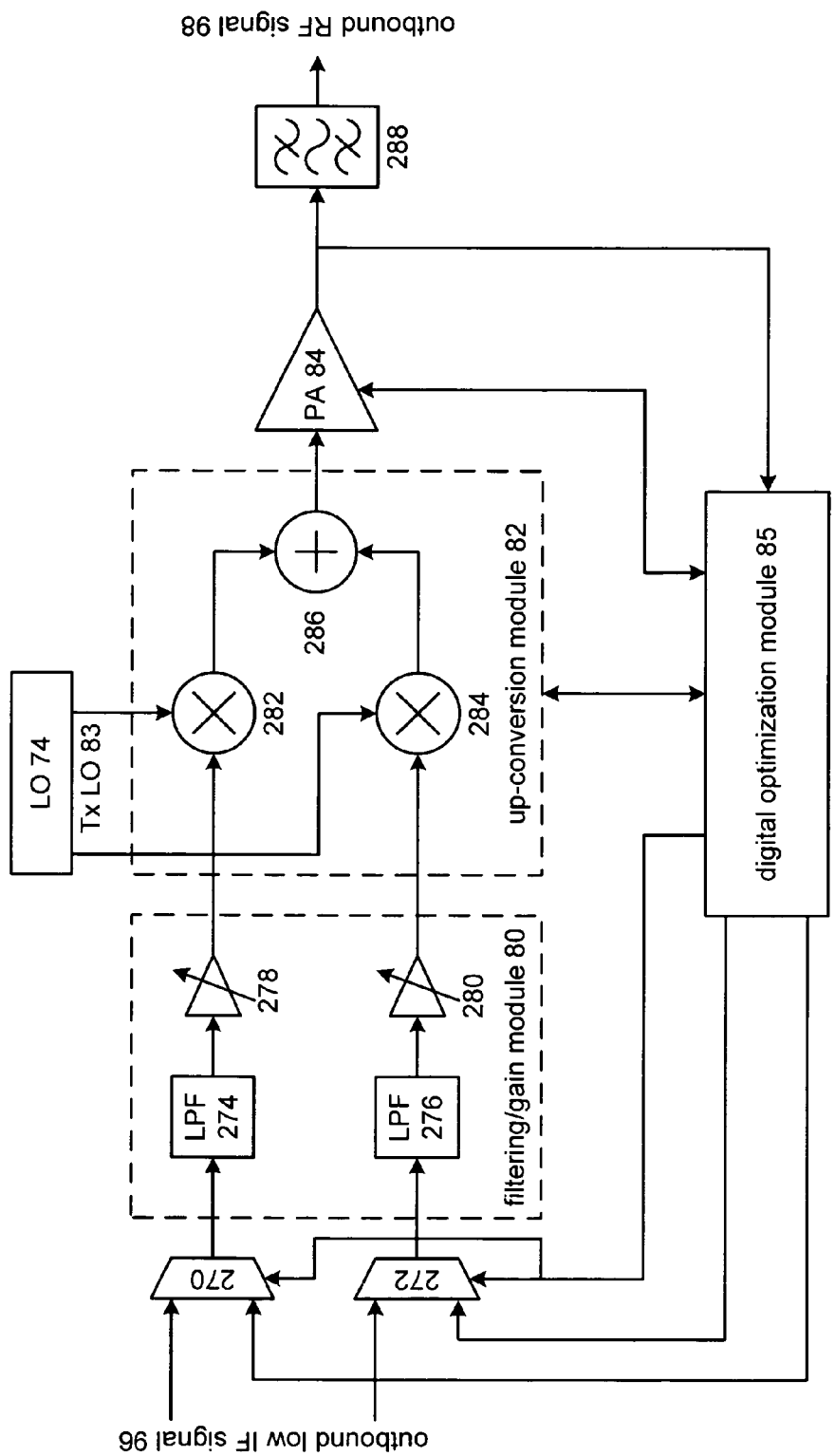
FIG. 11 illustrates a schematic block diagram of an analog radio transmitter and digital optimization module in accordance with the present invention.

FIG. 11 illustrates a schematic block diagram of an analog radio transmitter 79 that may be constructed in accordance with an IEEE 802.11B standard to perform direct conversion and/or in accordance with the Bluetooth standard to convert a low IF signal into an RF signal. In either embodiment, the analog radio transmitter 79 may be a self-calibrating transmitter as disclosed in related patent applications # 16 and/or # 18.

During normal operation, the digital optimization module 85 causes multiplexors 270 and 272 to pass I and Q components of outbound low IF signal 96 to the filter/gain module 80. The filter/gain module 80 includes low pass filters 274 and 276 and variable gain stages 278 and 280. The resulting filtered and gained I and Q signals are provided to the up-conversion module 82, which includes a $1^{st}$ mixing module 282, a $2^{nd}$ mixing module 284 and a summing module 286. Note that the mixing modules 282 and 284 may be programmable mixers as disclosed in related patent application # 19. The $1^{st}$ and $2^{nd}$ mixing modules 282 and 284 mix their respective inputs with the transmitter local oscillation to produce $1^{st}$ and $2^{nd}$ mixed signals. The summing module sums the $1^{st}$ and $2^{nd}$ mixed signals to produce a summed signal.

The power amplifier receives the output from the up-conversion module 82 and amplifies it. The power amplifier 84 may be implemented as disclosed in accordance with the teachings of related patent applications # 14 and/or # 15. The resulting amplified signal is provided to a bandpass filter 284 and subsequently transmitted as the outbound RF signals 98.

During test mode, the digital optimization module 85 causes the multiplexors 270 and 272 to provide a test signal to the filtering/gain module 80. Related patent applications # 16 and/or # 18 disclose the self-calibration operation for an analog radio transmitter.

Figure 12:
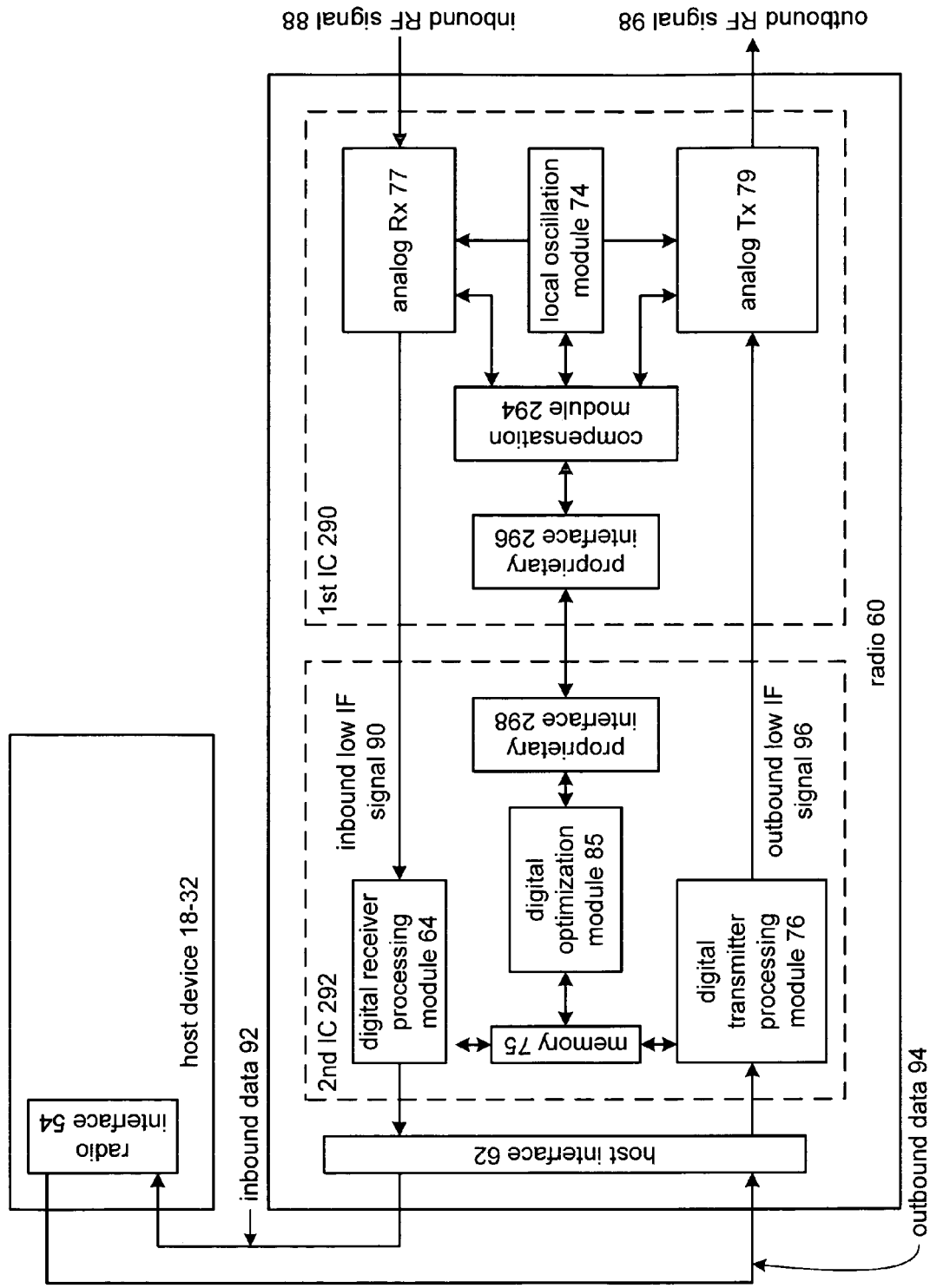
FIG. 12 illustrates a schematic block diagram of a host and an alternate embodiment of the corresponding radio in accordance with the present invention.

FIG. 12 illustrates an alternate schematic block diagram of radio 60 operably coupled to host device 18-32. In this embodiment, the radio 60 includes a $1^{st}$ integrated circuit 290 and a $2^{nd}$ integrated circuit 292. The $1^{st}$ integrated circuit 290 includes the analog receiver section 77, the local oscillation module 74, the analog transmitter section 79, a compensation module 294 and a proprietary interface 296. The $2^{nd}$ integrated circuit 292 includes the digital receiver processing module 64, the memory 75, the digital optimization module 85, the digital transmitter processing module 76, and a proprietary interface 298. In this embodiment, the compensation performed within the analog receiver section 77, the local oscillation module 74 and/or the analog transmitter section 79 is performed via the compensation module 294. The monitoring data collected regarding the performance of the analog receiver section 77, the local oscillation module 74 and/or the analog transmitter section 79 is provided to the $2^{nd}$ integrated circuit 294 via the proprietary interface 296.

The digital optimization module 85 receives the monitoring data via the proprietary interface 298 and produces the corresponding compensation control signals therefrom. The digital optimization module 85 provides the compensation control signals back to the $1^{st}$ integrated circuit 290 via the proprietary interfaces 298 and 296.

By including the proprietary interfaces 296 and 298, the flexibility of the digital signal processing within the $2^{nd}$ integrated circuits 292 may be leveraged to optimize the performance of the analog circuitry within the $1^{st}$ integrated circuit 290. As one of average skill in the art will appreciate, if the $1^{st}$ and $2^{nd}$ integrated circuits 290 and 292 were implemented on the same piece of silicon, the proprietary interfaces 296 and 298 may be omitted.

The preceding discussion has presented a radio frequency integrated circuit that leverages the digital processing to optimize performance of the analog sections of a radio. Accordingly, direct conversion radio transceivers utilizing the teachings of the present invention are more reliable in wireless communication devices, consume less power, produce less errors, and are more cost effective than previous radio frequency integrated circuits. As one of average skill in the art will appreciate other embodiments may be derived from the teaching of the present invention, without deviating from the scope of the claims.

What is claimed is:

1. An integrated radio system comprises:
   direct conversion analog receiver operably coupled to produce an inbound baseband signal by down-converting an inbound radio frequency (RF) signal, wherein the direct conversion analog receiver includes:
      programmable low noise amplifier operably coupled to produce an amplified inbound RF signal by amplifying the inbound RF signal in accordance with an LNA gain control signal;
      down-conversion module operably coupled to convert the amplified inbound RF signal into an I component down-converted signal and a Q component down-converted signal;
      first low pass filter operably coupled to filter the I component of the down-converted signal to produce a filtered I component;
      second low pass filter operably coupled to filter the Q component of the down-converted signal to produce a filtered Q component;
      first amplifier operably coupled to produce an I component of the inbound baseband signal by amplifying the filtered I component; and
      second amplifier operably coupled to produce a Q component of the inbound baseband signal by amplifying the filtered Q component;
   direct conversion analog transmitter operably coupled to produce an outbound RF signal by up-converting an outbound baseband signal;
   analog to digital conversion module operably coupled to convert the inbound baseband signal into an inbound digital baseband signal;

digital to analog conversion module operably coupled to convert an outbound digital baseband signal into the outbound baseband signal;

digital baseband processor operably coupled to process the inbound digital baseband signal and the outbound digital baseband signal in accordance with one of a plurality of radio transceiver standards; and digital optimization module operably coupled to optimize performance of at least one of the direct conversion analog receiver and the direct conversion analog transmitter for the one of the plurality of radio transceiving standards.

2. An integrated radio system comprises:

direct conversion analog receiver operably coupled to produce an inbound baseband signal by down-converting an inbound radio frequency (RF) signal, wherein the direct conversion analog receiver includes:

low noise amplifier operably coupled to amplify the inbound RF signal to produce an amplified inbound RF signal;

first programmable mixer operably coupled to produce an I component down-converted signal by mixing an I component of the amplified inbound RF signal with an I component of a local oscillation in accordance with a first mixing compensation control signal;

second programmable mixer operably coupled to produce a Q component down-converted signal by mixing a Q component of the amplified inbound RF signal with a Q component of the local oscillation in accordance with a second mixing compensation control signal;

first filter operably coupled to filter the I component of the down-converted signal to produce a filtered I component;

second filter operably coupled to filter the Q component of the down-converted signal to produce a filtered Q component;

first amplifier operably coupled to produce an I component of the inbound low baseband by amplifying the filtered I component; and second amplifier operably coupled to produce a Q component of the inbound baseband signal by amplifying the filtered Q component;

direct conversion analog transmitter operably coupled to produce an outbound RF signal by up-converting an outbound baseband signal;

analog to digital conversion module operably coupled to convert the inbound baseband signal into an inbound digital baseband signal;

digital to analog conversion module operably coupled to convert an outbound digital baseband signal into the outbound baseband signal;

digital baseband processor operably coupled to process the inbound digital baseband signal and the outbound digital baseband signal in accordance with one of a plurality of radio transceiver standards; and digital optimization module operably coupled to optimize performance of at least one of the direct conversion analog receiver and the direct conversion analog transmitter for the one of the plurality of radio transceiving standards.

3. An integrated radio system comprises:

direct conversion analog receiver operably coupled to produce an inbound baseband signal by down-converting an inbound radio frequency (RF) signal;

direct conversion analog transmitter operably coupled to produce an outbound RF signal by up-converting an outbound baseband signal, wherein the direct conversion analog transmitter includes:

offset compensation module operably coupled to produce a compensated outbound baseband signal by compensating the outbound baseband signal in accordance with an offset compensation control signal;

first filter operably coupled to produce a filtered I component of the outbound baseband signal by filtering the compensated outbound baseband signal;

second filter operably coupled to produce a filtered Q component of the outbound baseband signal by filtering the compensated outbound baseband signal;

up-conversion module operably coupled to produce an up-converted signal by up-converting the filtered I and Q components with respect to a local oscillation; and amplifier operably coupled to produce the outbound RF signal by amplifying the up-converted signal;

analog to digital conversion module operably coupled to convert the inbound baseband signal into an inbound digital baseband signal;

digital to analog conversion module operably coupled to convert an outbound digital baseband signal into the outbound baseband signal;

digital baseband processor operably coupled to process the inbound digital baseband signal and the outbound digital baseband signal in accordance with one of a plurality of radio transceiver standards; and digital optimization module operably coupled to optimize performance of at least one of the direct conversion analog receiver and the direct conversion analog transmitter for the one of the plurality of radio transceiving standards.

4. An integrated radio system comprises:

direct conversion analog receiver operably coupled to produce an inbound baseband signal by down-converting an inbound radio frequency (RF) signal;

direct conversion analog transmitter operably coupled to produce an outbound RF signal by up-converting an outbound baseband signal, wherein the direct conversion analog transmitter includes:

first filter operably coupled to produce a filtered I component of the outbound baseband signal by filtering the outbound baseband signal;

second filter operably coupled to produce a filtered Q component of the outbound baseband signal by filtering the outbound baseband signal;

first programmable mixer operably coupled to produce a first mixed signal by mixing the filtered I component of the outbound baseband signal with an I component of a local oscillation in accordance with a first mixer compensation control signal;

second programmable mixer operably coupled to produce a second mixed signal by mixing the filtered Q component of the outbound baseband signal with a Q component of the local oscillation in accordance with a second mixer compensation control signal;

summing module operably coupled to produce an up-converted signal by summing the first mixed signal with the second mixed signal; and amplifier operably coupled to produce the outbound RF signal by amplifying the up-converted signal;

analog to digital conversion module operably coupled to convert the inbound baseband signal into an inbound digital baseband signal;

digital to analog conversion module operably coupled to convert an outbound digital baseband signal into the outbound baseband signal;

digital baseband processor operably coupled to process the inbound digital baseband signal and the outbound digital baseband signal in accordance with one of a plurality of radio transceiver standards; and digital optimization module operably coupled to optimize performance of at least one of the direct conversion analog receiver and the direct conversion analog transmitter for the one of the plurality of radio transceiving standards.

* * * * *